United States Patent
Hermerding, II et al.

(10) Patent No.: US 11,209,888 B2
(45) Date of Patent: Dec. 28, 2021

(54) HISTORY BASED PEAK POWER PREDICTION

(71) Applicant: Intel Corporation, Santa Clara, CA (US)

(72) Inventors: James G. Hermerding, II, Vancouver, WA (US); Alexander B. Uan-Zo-Li, Hillsboro, OR (US); Brian C. Fritz, Milpitas, CA (US); Naoki Matsumura, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 504 days.

(21) Appl. No.: 15/721,219

(22) Filed: Sep. 29, 2017

(65) Prior Publication Data

US 2019/0101597 A1    Apr. 4, 2019

(51) Int. Cl.
*G06F 1/3212* (2019.01)
*G01R 31/36* (2020.01)

(52) U.S. Cl.
CPC ........... *G06F 1/3212* (2013.01); *G01R 31/36* (2013.01)

(58) Field of Classification Search
CPC . G01R 31/3828; G01R 31/387; H02J 7/0047; H02J 7/0073
See application file for complete search history.

(56) References Cited

U.S. PATENT DOCUMENTS

| | | | | |
|---|---|---|---|---|
| 6,313,606 B1* | 11/2001 | Eguchi | ............... | G01R 31/3648 320/132 |
| 8,466,684 B2* | 6/2013 | Melichar | ............ | G01R 31/3648 324/426 |
| 2003/0117143 A1* | 6/2003 | Okada | ................ | G01R 31/3828 324/428 |
| 2004/0070371 A1* | 4/2004 | Chern | ................... | G06F 1/3203 320/136 |
| 2008/0007224 A1* | 1/2008 | Melichar | ............ | G01R 31/3648 320/132 |
| 2009/0254290 A1* | 10/2009 | Kim | ...................... | H01M 10/48 702/63 |
| 2011/0148363 A1* | 6/2011 | Frisch | .............. | G01R 19/16542 320/162 |
| 2012/0215517 A1 | 8/2012 | Bohlen et al. | | |
| 2014/0218041 A1 | 8/2014 | Cho et al. | | |
| 2014/0336963 A1 | 11/2014 | Ji et al. | | |
| 2015/0277535 A1 | 10/2015 | Uan-Zo-Li et al. | | |
| 2016/0190833 A1 | 6/2016 | Roumi et al. | | |

FOREIGN PATENT DOCUMENTS

WO    2013060802 A1    5/2013

OTHER PUBLICATIONS

Richard Perez, Lead Acid Battery State of Charge vs. voltage, Home Power 36, 1993 (Year: 1993).*
International Search Report and Written Opinion for International Patent Application No. PCT/US2018/048750, dated Jan. 16, 2019, 11 pages.

* cited by examiner

*Primary Examiner* — Kyle R Quigley
(74) *Attorney, Agent, or Firm* — Jordan IP Law, LLC (57) ABSTRACT

An embodiment of a semiconductor package apparatus may include technology to determine history information for a battery, predict a peak power capacity of the battery based on the history information, and set a peak power parameter based on the predicted peak power capacity.

20 Claims, 4 Drawing Sheets

HISTORY BASED PEAK POWER PREDICTION

TECHNICAL FIELD

Embodiments generally relate to power systems. More particularly, embodiments relate to history based peak power prediction.

BACKGROUND

Power availability is important to a variety of electronic devices and systems. For many computer devices, there may be a tradeoff between power consumption and performance. A computer system may include various parameters and/or settings which affect power delivery and/or performance.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
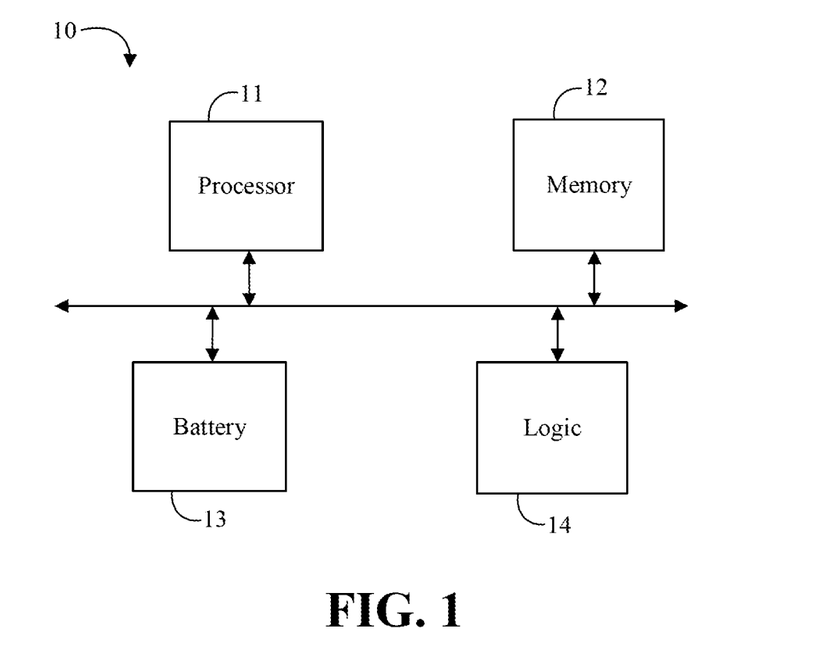
FIG. 1 is a block diagram of an example of an electronic processing system according to an embodiment.

Turning now to FIG. 1, an embodiment of an electronic processing system 10 may include a processor 11, memory 12 communicatively coupled to the processor 11, a battery 13 coupled to the processor 11 and the memory 12 to provide power to at least the processor 11 and the memory 12, and logic 14 communicatively coupled to the battery 13 to determine history information for the battery 13, predict a peak power capacity of the battery 13 based on the history information, and set a peak power parameter based on the predicted peak power capacity. In some embodiments, the logic 14 may be further to determine one or more of prior direct current (DC) loading information and prior voltage information for the battery as part of the history information. For example, the logic may be configured to measure one or more of current drawn from the battery 13 and battery voltage over a window of time as part of the history information (e.g., over the same period of time). In some embodiments, the logic 14 may set the peak power parameter based on an offset from a resting peak power value and an integration of the measured current over the time window. Alternatively, or additionally, the logic 14 may set the peak power parameter based on a measured impedance of the battery 13. In any of the foregoing examples, the logic 14 may be configured to predict a greater peak power capacity based on history information which indicates the battery 13 has been recently resting as compared to history information which indicates that the battery 13 has been recently loaded.

Embodiments of each of the above processor 11, memory 12, battery 13, logic 14, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the memory 12, persistent storage media, or other system memory may store a set of instructions which when executed by the processor 11 cause the system 10 to implement one or more components, features, or aspects of the system 10 (e.g., the logic 14, determining history information for the battery 13, predicting a peak power capacity of the battery 13 based on the history information, setting a peak power parameter based on the predicted peak power capacity, etc.).

Figure 2:
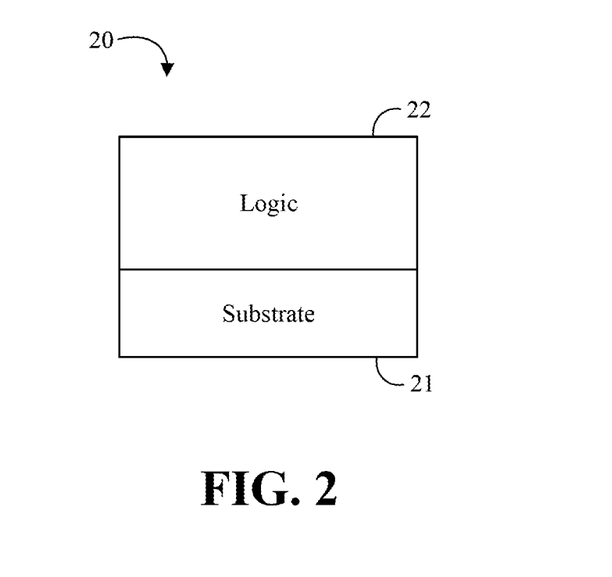
FIG. 2 is a block diagram of an example of a semiconductor package apparatus according to an embodiment.

Turning now to FIG. 2, an embodiment of a semiconductor package apparatus 20 may include a substrate 21, and logic 22 coupled to the substrate 21, wherein the logic 22 is at least partly implemented in one or more of configurable logic and fixed-functionality hardware logic. The logic 22 coupled to the substrate 21 may be configured to determine history information for a battery, predict a peak power capacity of the battery based on the history information, and set a peak power parameter based on the predicted peak power capacity. In some embodiments, the logic 22 may be further configured to determine one or more of prior DC loading information and prior voltage information for the battery as part of the history information. For example, the logic 22 may also be configured to measure current drawn from the battery, and/or battery voltage over a window of time as part of the history information. In some embodiments, the logic 22 may set the peak power parameter based on an offset from a resting peak power value and an integration of measured power usage over the time window. Alternatively, or additionally, the logic 22 may set the peak power parameter based on a measured impedance of the battery. In any of the foregoing examples, the logic 22 may be configured to predict a greater peak power capacity based on history information which indicates the battery has been recently resting as compared to history information which indicates that the battery has been recently loaded.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Figure 3A:
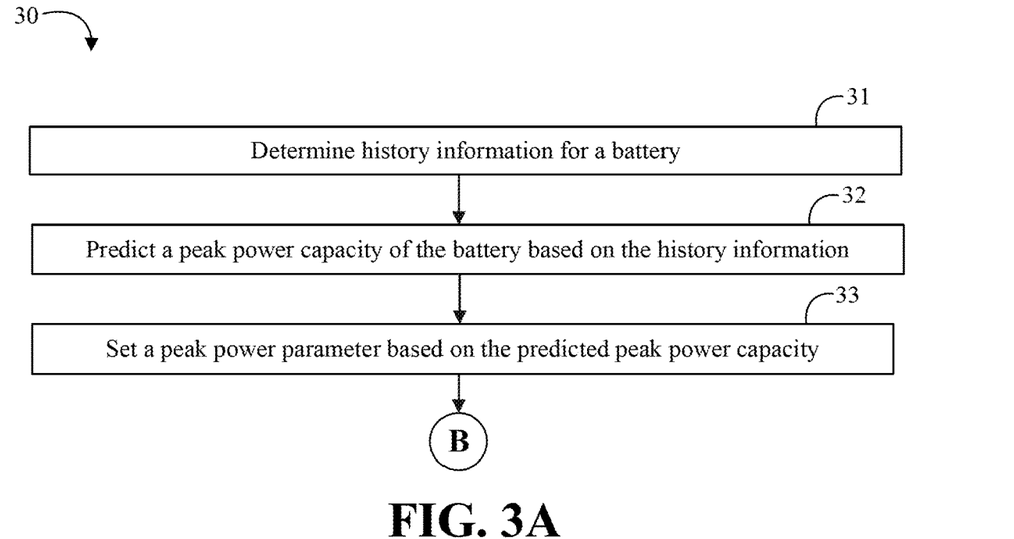
FIGS. 3A to 3B are flowcharts of an example of a method of setting a parameter according to an embodiment.
Figure 3B:
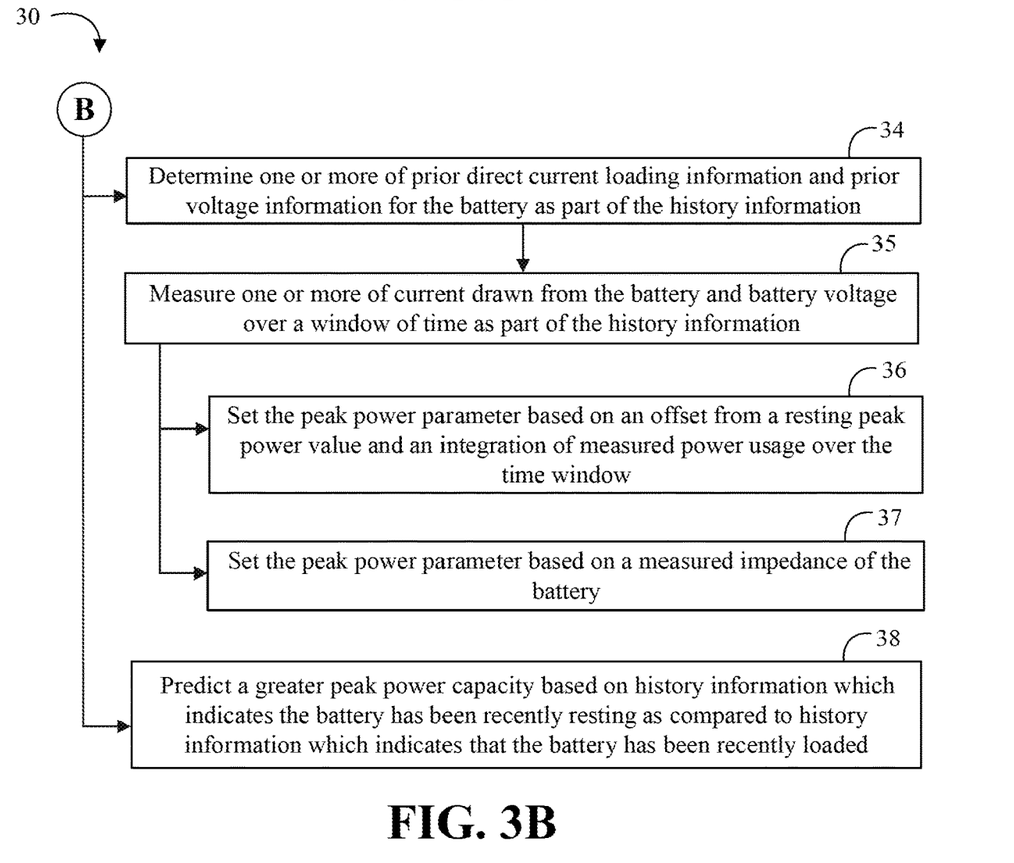

Turning now to FIGS. 3A to 3B, an embodiment of a method 30 of setting a parameter may include determining history information for a battery at block 31, predicting a peak power capacity of the battery based on the history information at block 32, and setting a peak power parameter based on the predicted peak power capacity at block 33. Some embodiments of the method 30 may further include determining one or more of prior DC loading information and prior voltage information for the battery as part of the history information at block 34. For example, some embodiments may include measuring one or more of current drawn from the battery and battery voltage over a window of time as part of the history information at block 35. The method 30 may also include setting the peak power parameter based on an offset from a resting peak power value and an integration of measured power usage over the time window at block 36. Alternatively, or additionally, the method 30 may include setting the peak power parameter based on a measured impedance of the battery at block 37. Some embodiments of the method 30 may also include predicting a greater peak power capacity based on history information which indicates the battery has been recently resting as compared to history information which indicates that the battery has been recently loaded at block 38.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Figure 4:
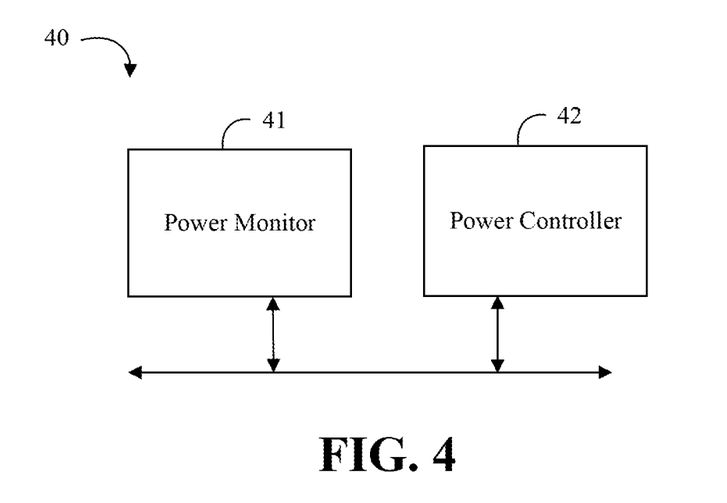
FIG. 4 is a block diagram of an example of a power parameter setter according to an embodiment.

For example, the method 30 may be implemented on a computer readable medium as described in connection with Examples 19 to 24 below. Embodiments or portions of the method 30 may be implemented in applications (e.g., through an application programming interface (API)) or driver software running on an operating system (OS). Other embodiments or portions of the method 30 may be implemented in firmware Turning now to FIG. 4, some embodiments may be logically or physically arranged as one or more modules. For example, an embodiment of a power parameter setter 40 may include a power monitor 41 communicatively coupled to a power controller 42. For example, the power monitor 41 may be configured to monitor power usage of a battery and to maintain history information for the battery power usage, while the power controller 42 may be configured to predict a peak power capacity of the battery based on the history information, and set a peak power parameter based on the predicted peak power capacity. The power monitor 41 may include fuel gauge circuits or features which may be configured to monitor and/or report power usage and battery information (e.g., such as state of charge). In some embodiments, the power monitor 41 may be further configured to determine one or more of prior DC loading information and prior voltage information for the battery as part of the history information. For example, the power monitor 41 may also be configured to measure power usage and/or current drawn from the battery and/or battery voltage over a window of time as part of the history information. In some embodiments, the power controller 42 may set the peak power parameter based on an offset from a resting peak power value and an integration of measured power usage over the time window. Alternatively, or additionally, the power controller 42 may set the peak power parameter based on a measured impedance of the battery. In any of the foregoing examples, the power controller 42 may be configured to predict a greater peak power capacity based on history information which indicates the battery has been recently resting as compared to history information which indicates that the battery has been recently loaded.

Embodiments of the power monitor 41, the power controller 42, and other components of the power parameter setter 40, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Some embodiments may advantageously increase the performance of a system-on-chip (SOC) device by predicting accurately the battery peak power. Various SOC devices may have a wide variety of power requirements, with some SOC devices having increased peak power ability. Some systems/platforms may use a parameter to indicate to various components of the system a peak power for each component. For example, a Pmax parameter may correspond to a maximum power value for the complete platform, a PL1 parameter may correspond to a desired maximum indefinite power usage for a particular component (e.g., the SOC) of the platform, a PL2 parameter may correspond to a desired average power usage for the component (e.g., which may be exceeded briefly), and a PL4 parameter may correspond to a physical limit for power usage for the component (e.g. the CPU). A problem for some platforms from the peak power point of view is the possibility that due to an I*R voltage drop, the voltage seen by the system may droop below the minimum allowable levels. To account for this problem, some platforms may set conservative power parameters (e.g., the PL4 parameter for a SOC), which also sets the maximum frequency of the CPU cores and directly affects the performance. Some embodiments may set a less conservative power parameter based on power history information to advantageously provide better CPU performance without incurring substantial risk of excessive voltage droop.

Figure 5:
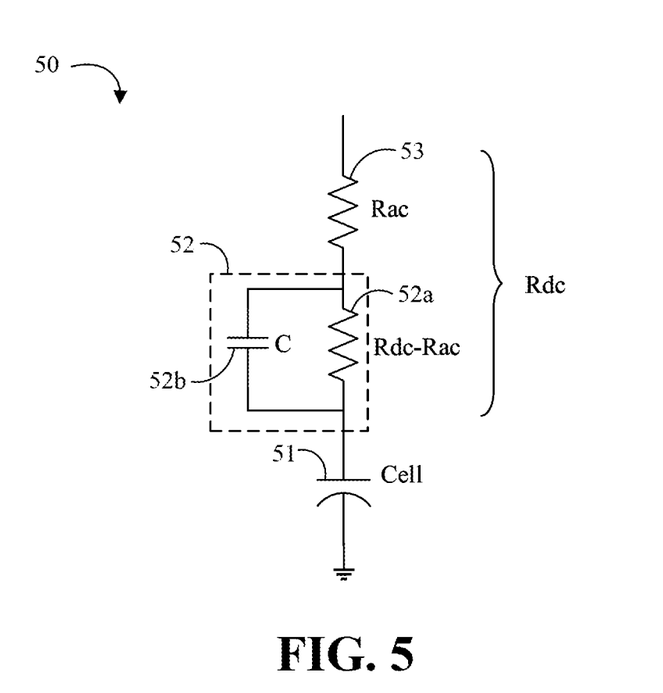
FIG. 5 is an illustrative schematic diagram of an example of a battery cell model according to an embodiment.

Turning to FIG. 5, a battery 50 may be represented as a series of R-C networks connected in series. In some models, the battery 50 may include a cell 51 which may be represented as a very large capacitor, connected in series with an R-C network 52 (e.g., resistor 52a connected in parallel with capacitor 52b) and a resistor 53. One factor which may significantly affect the peak power available from the battery may include the initial loading of the battery. When the cell 51 is loaded with a constant load (e.g., on the order of seconds to tens of seconds), the actual voltage seen by the system can be calculated assuming that the cell impedance is Rdc. For a fast transient power spike (e.g., on the order of milliseconds), the impedance seen by the current is Rac. The system voltage droop due to a power spike at the system (e.g., including the SOC) may depend on the history of the power taken from the battery 50. For example, if the battery 50 has been rested, the voltage droop will be lower than it is for a battery 50 which has been producing power for tens of seconds.

Figure 6:
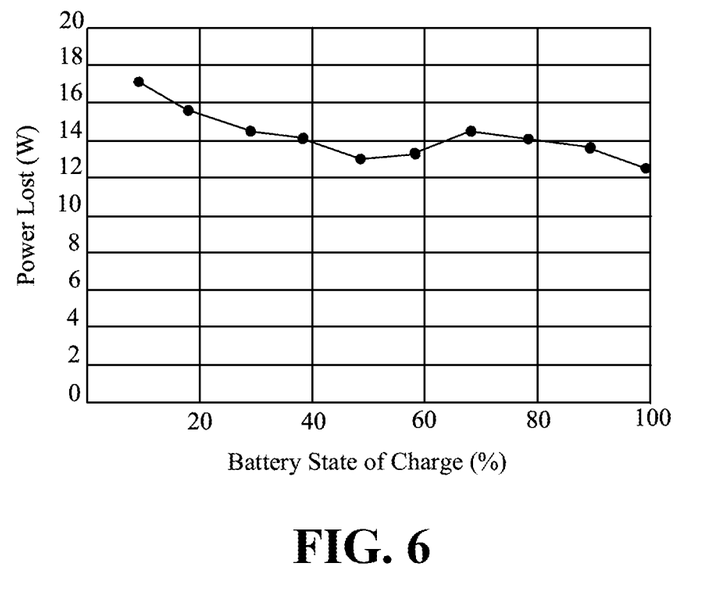
FIG. 6 is an illustrative graph of state of charge versus power lost according to an embodiment.

Turning now to FIG. 6, an illustrative graph shows the difference in an allowable PL4 level for a SOC with a typical battery which may be loaded with 30 W of power for tens of seconds, versus the same system where the battery was rested. Referring to the graph at a 40% state of charge, for example, about 14 W of power may be lost for the loaded battery as compared to a rested battery. In some systems, when the PL4 level is set, the value for the PL4 level may be based on a conservative assumption that the battery has been delivering PL2 level of power (e.g., tens of Watts) for multiple seconds. This assumption may result in a lower PL4 settings and consequently may limit the performance of the SOC. For example, setting the PL4 parameter lower by 13 W may cause the loss of a few bins in a multi-threaded operation (e.g., where each lost bin corresponds to a decrease in the processor frequency). Advantageously, some embodiments may monitor the battery usage to determine the history of the battery (e.g., if it was recently rested or more lightly loaded) and give that 13 W of power back to the power envelope by adjusting the PL4 level higher if the history information and predicted peak power capacity supports such a parameter setting.

For many or most systems, the PL4 setting may more closely correspond to the maximum power that the battery can provide for a very short duration (e.g., measured in milliseconds, or even potentially in microseconds). In accordance with some embodiments, the amount of power that can be drawn from the battery for such short duration may depend on the history of power drawn from the battery for tens of seconds. Some embodiments may determine history information for the battery to set the power parameter values higher and provide better performance. For example, some embodiments may modulate the PL4 level based on the measured low frequency (e.g., hundreds of milliseconds or seconds) current actually consumed by the system from the battery and/or the average voltage of the battery. Various techniques may be used to determine or calculate an actual or more accurate peak power capacity of the battery pack, without relying on assumed worst case conditions (e.g., which in many or most cases may not be applicable). Some embodiments may advantageously be utilized in combination with other techniques to support higher Pmax value for a system, such as fast processor temperature assertions, active Vmin protection, etc.

Figure 7:
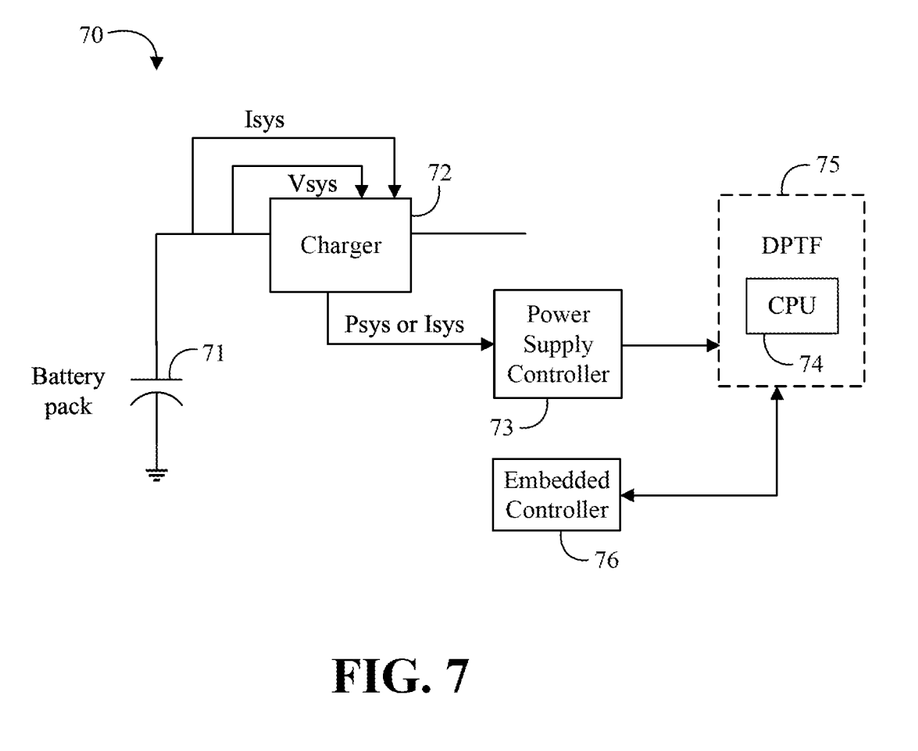
FIG. 7 is a block diagram of another example of an electronic processing system according to an embodiment.

Turning now to FIG. 7, an embodiment of an electronic processing system 70 may include a battery 71 coupled to a charger circuit 72. The charger circuit 72 may provide a signal to a power supply controller 73 which indicates current draw, voltage or state of charge. In some embodiments, the power supply controller 73 may include an INTEL MOBILE VOLTAGE POSITIONING (MVP) power supply controller. For example, the charger 72 may measure the output current and voltage of the battery 71 and may report either the output power or output current of the battery 71. This information may be transmitted to the power supply controller 73 (e.g., the signal from the charger 72 may be a small current source), and the power supply controller 73 may digitize the data and then send it to a central processor unit (CPU) 74 (e.g. through a bus protocol such as serial voltage identification (SVID)). The CPU 74 may include DYNAMIC PLATFORM AND THERMAL FRAMEWORK (DPTF) 75 features and may also be communicatively coupled to an embedded controller 76. In accordance with some embodiments, firmware inside the DPTF 75 and/or the embedded controller 76 may be configured to use the data from the power supply controller 73 to set the PL4 level based on history information for the battery 71. For example, the PL4 level may be set based on a history of power and/or current drawn from the battery 71. Some embodiments may alternatively, or additionally, determine an impedance of the battery 71 as a function of duration of power drawn from the battery 71. Aspects of various embodiments may be implemented in the embedded controller 76, the DPTF 75, and/or a fuel gauge module of the system.

Any of a number of techniques may be utilized to predict a peak power and/or to adjust the PL4 level based on the history of power/current drawn from the battery. Some embodiments may set the peak power parameter based on an offset from a resting peak power value and an integration of the measured power or current over a time window. For example, some embodiments may integrate a system power value (Psys) over time and set the PL4 level based on an offset from a resting PL4 level:

$$\text{PL4\_set} = \text{PL4\_fromrest} - k^* \int_{t1}^{t} P_{sys} dt \qquad \text{(Eq. 1)}$$

where PL4_set may correspond to the adjusted PL4 parameter for the SOC, PL4_fromrest may correspond to the PL4 level based on an idle battery, and Psys may correspond to a measured power consumed by the system from the battery. The time interval for the integration (e.g., from time "t" to time "t1"), as well as a coefficient "k" may be dependent on the characteristics of the battery and/or the system. In some embodiments, these values may be user configurable and/or may be adjusted by a system developer or end user.

Some embodiments may alternatively set the peak power parameter based on a measured impedance of the battery.

For example, a voltage Vdroop corresponding to a voltage after the droop due to a high power spike may be determined as follows:

$$Vdroop = Vopen - Idc * (Rdc - Rac) - Iac * Rac \quad (\text{Eq. 2})$$

where Vopen may correspond to an open circuit voltage of the battery (e.g. reported by the fuel gauge), Rdc may correspond to the DC impedance of the battery pack and the system (e.g., a measured value), Rac may correspond to the impedance of the battery pack and the system (e.g., a measured value) to short duration spikes, Iac may correspond to the battery current during the power spike, and Idc may correspond to the battery current for a long duration. For a given Cdroop, the controller can calculate the allowable Iac, and thus the peak power for the SOC, PL4.

Idc may be a measured battery current after a low-pass filter (e.g., on the order of seconds). Rdc and Rac may be known parameters of the battery. Vopen may be reported by the fuel gauge. In accordance with some embodiments, the product of Iac and Vopen-Vdroop (e.g., where Vdroop may cause the system to reach the system minimum voltage) may correspond to the peak power capability of the battery. The peak power parameter may be set based on the calculated peak power capability. For example, firmware code may calculate the maximum capability of the battery using Eq. 2 and then make a determination or read a system parameter corresponding to the rest of the platform (ROP) peak power, to estimate the maximum short duration power that the SOC can consume before the system voltage drops to the minimum allowable value.

Some embodiments may rely on the actual measured value of the system voltage and current (e.g., with low-pass filtering) and may estimate the battery peak power capability using Eq. 2, but with an adjustment due to the known voltage at DC as follows:

$$Pmax = Vmin * \frac{(Vmeas - Vmin + Idc * Rac)}{Rac} \quad (\text{Eq. 3})$$

where Vmin may correspond to the minimum system voltage, Vmeas may correspond to the measured filtered system voltage, and Idc may correspond to the measured filtered battery current. The SOC PL4 may be defined as the difference between the Pmax and the maximum power for the Rest of the Platform (ROP).

In some embodiments, any of the foregoing calculations may be performed in any of the embedded controller, the DPTF, and/or the fuel gauge. Advantageously, some embodiments take into account an increased power capability of the battery with a prior low power load to improve potential performance for a SOC (e.g., or other platform component). For example, some embodiments may raise a multi-threaded maximum frequency by two to three bins as compared to a conventional system, which may set the PL4 parameter more conservatively.

ADDITIONAL NOTES AND EXAMPLES

Example 1 may include an electronic processing system, comprising a processor memory communicatively coupled to the processor, a battery coupled to the processor and the memory to provide power to at least the processor and the memory, and logic communicatively coupled to the battery to determine history information for the battery, predict a peak power capacity of the battery based on the history information, and set a peak power parameter based on the predicted peak power capacity.

Example 2 may include the system of Example 1, wherein the logic is further to determine one or more of prior direct current loading information and prior voltage information for the battery as part of the history information.

Example 3 may include the system of Example 2, wherein the logic is further to measure one or more of current drawn from the battery and battery voltage over a window of time as part of the history information.

Example 4 may include the system of Example 3, wherein the logic is further to set the peak power parameter based on an offset from a resting peak power value and an integration of the measured current over the time window.

Example 5 may include the system of Example 3, wherein the logic is further to set the peak power parameter based on a measured impedance of the battery.

Example 6 may include the system of any of Examples 1 to 5, wherein the logic is further to predict a greater peak power capacity based on history information which indicates the battery has been resting as compared to history information which indicates that the battery has been loaded.

Example 7 may include a semiconductor package apparatus, comprising a substrate, and logic coupled to the substrate, wherein the logic is at least partly implemented in one or more of configurable logic and fixed-functionality hardware logic, the logic coupled to the substrate to determine history information for a battery, predict a peak power capacity of the battery based on the history information, and set a peak power parameter based on the predicted peak power capacity.

Example 8 may include the apparatus of Example 7, wherein the logic is further to determine one or more of prior direct current loading information and prior voltage information for the battery as part of the history information.

Example 9 may include the apparatus of Example 8, wherein the logic is further to measure one or more of current drawn from the battery and battery voltage over a window of time as part of the history information.

Example 10 may include the apparatus of Example 9, wherein the logic is further to set the peak power parameter based on an offset from a resting peak power value and an integration of measured power usage over the time window.

Example 11 may include the apparatus of Example 9, wherein the logic is further to set the peak power parameter based on a measured impedance of the battery.

Example 12 may include the apparatus of any of Examples 7 to 11, wherein the logic is further to predict a greater peak power capacity based on history information which indicates the battery has been recently resting as compared to history information which indicates that the battery has been recently loaded.

Example 13 may include a method of setting a parameter, comprising determining history information for a battery, predicting a peak power capacity of the battery based on the history information, and setting a peak power parameter based on the predicted peak power capacity.

Example 14 may include the method of Example 13, further comprising determining one or more of prior direct current loading information and prior voltage information for the battery as part of the history information.

Example 15 may include the method of Example 14, further comprising measuring one or more of current drawn from the battery and battery voltage over a window of time as part of the history information.

Example 16 may include the method of Example 15, further comprising setting the peak power parameter based on an offset from a resting peak power value and an integration of measured power usage over the time window.

Example 17 may include the method of Example 15, further comprising setting the peak power parameter based on a measured impedance of the battery.

Example 18 may include the method of any of Examples 13 to 17, further comprising predicting a greater peak power capacity based on history information which indicates the battery has been recently resting as compared to history information which indicates that the battery has been recently loaded.

Example 19 may include at least one computer readable medium, comprising a set of instructions, which when executed by a computing device, cause the computing device to determine history information for a battery, predict a peak power capacity of the battery based on the history information, and set a peak power parameter based on the predicted peak power capacity.

Example 20 may include the at least one computer readable medium of Example 19, comprising a further set of instructions, which when executed by the computing device, cause the computing device to determine one or more of prior direct current loading information and prior voltage information for the battery as part of the history information.

Example 21 may include the at least one computer readable medium of Example 20, comprising a further set of instructions, which when executed by the computing device, cause the computing device to measure one or more of current drawn from the battery and battery voltage over a window of time as part of the history information.

Example 22 may include the at least one computer readable medium of Example 21, comprising a further set of instructions, which when executed by the computing device, cause the computing device to set the peak power parameter based on an offset from a resting peak power value and an integration of measured power usage over the time window.

Example 23 may include the at least one computer readable medium of Example 21, comprising a further set of instructions, which when executed by the computing device, cause the computing device to set the peak power parameter based on a measured impedance of the battery.

Example 24 may include the at least one computer readable medium of any of Examples 19 to 23, comprising a further set of instructions, which when executed by the computing device, cause the computing device to predict a greater peak power capacity based on history information which indicates the battery has been recently resting as compared to history information which indicates that the battery has been recently loaded.

Example 25 may include a power parameter setter apparatus, comprising means for determining history information for a battery, means for predicting a peak power capacity of the battery based on the history information, and means for setting a peak power parameter based on the predicted peak power capacity.

Example 26 may include the apparatus of Example 25, further comprising means for determining one or more of prior direct current loading information and prior voltage information for the battery as part of the history information.

Example 27 may include the apparatus of Example 26, further comprising means for measuring one or more of current drawn from the battery and battery voltage over a window of time as part of the history information.

Example 28 may include the apparatus of Example 27, further comprising means for setting the peak power parameter based on an offset from a resting peak power value and an integration of measured power usage over the time window.

Example 29 may include the apparatus of Example 27, further comprising means for setting the peak power parameter based on a measured impedance of the battery.

Example 30 may include the apparatus of any of Examples 25 to 29, further comprising means for predicting a greater peak power capacity based on history information which indicates the battery has been recently resting as compared to history information which indicates that the battery has been recently loaded.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SOCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
a processor;
memory communicatively coupled to the processor;
a battery coupled to the processor and the memory to provide power to at least the processor and the memory; and
logic communicatively coupled to the battery to:
  determine history information for the battery,
  predict a peak power capacity of the battery based on the history information,
  determine that a transient power spike occurred,
  in response to the transient power spike, identify a plurality of parameters, the plurality of parameters including a measured impedance of the battery and the system during the transient power spike, an open circuit voltage of the battery, a direct-current impedance of the battery and the system, a first current of the battery during the transient power spike, and a second current of the battery over a duration of time that is longer than a duration of time of the transient power spike,
  calculate a voltage of a voltage droop during the transient power spike based on each of the plurality of parameters, and
  set a peak power parameter based on the predicted peak power capacity and the voltage of the voltage droop, wherein the peak power parameter is to set a maximum power usage for a component that is to be powered by the battery.

2. The system of claim 1, wherein the logic is further to:
determine one or more of prior direct current loading information and prior voltage information for the battery as part of the history information,
wherein the peak power capacity is to correspond to a maximum power that the battery is to output for a duration of time before a voltage output of the battery is to drop below a minimum allowable level above zero, and
wherein the component is to be the processor.

3. The system of claim 1, wherein the logic is further to:
set the peak power parameter based on a subtraction operation based on a resting peak power value and an integration of measured power over a period of time, wherein the measured power is to be expressed in Watts.

4. The system of claim 1, wherein the logic is further to:
predict a greater peak power capacity based on history information which indicates the battery has been resting as compared to history information which indicates that the battery has been loaded.

5. The system of claim 1, wherein the logic is further to:
set the peak power parameter based on a minimum voltage of the system, a measured filtered voltage of the system, and a measured filtered current of the battery.

6. A semiconductor package apparatus, comprising:
a substrate; and
logic coupled to the substrate, wherein the logic is at least partly implemented in one or more of configurable logic or fixed-functionality logic hardware, the logic coupled to the substrate to:
  determine history information for a battery,
  predict a peak power capacity of the battery based on the history information,
  determine that a transient power spike occurred,
  in response to the transient power spike, identify a plurality of parameters, the plurality of parameters including a measured impedance of the battery and a system during the transient power spike, an open circuit voltage of the battery, a direct-current impedance of the battery and the system, a first current of the battery during the transient power spike, and a second current of the battery over a duration of time that is longer than a duration of time of the transient power spike,
  calculate a voltage of a voltage droop during the transient power spike based on each of the plurality of parameters, and
  set a peak power parameter based on the predicted peak power capacity and the voltage of the voltage droop, wherein the peak power parameter is to set a maximum power usage for a component that is to be powered by the battery.

7. The apparatus of claim 6, wherein the logic is further to:
determine one or more of prior direct current loading information and prior voltage information for the battery as part of the history information,
wherein the peak power capacity is to correspond to a maximum power that the battery is to output for a duration of time before a voltage output of the battery is to drop below a minimum allowable level above zero, and
wherein the component is to be a processor.

8. The apparatus of claim 6, wherein the logic is further to:
set the peak power parameter based on a subtraction operation based on a resting peak power value and an integration of measured power over a period of time, wherein the measured power is to be expressed in Watts.

9. The apparatus of claim 6, wherein the logic is further to:
predict a greater peak power capacity based on history information which indicates the battery has been recently resting as compared to history information which indicates that the battery has been recently loaded.

10. The apparatus of claim 6, wherein the logic is further to:
set the peak power parameter based on a minimum voltage of the system, a measured filtered voltage of the system, and a measured filtered current of the battery.

11. A method of setting a parameter, comprising:
determining history information for a battery;
predicting a peak power capacity of the battery based on the history information;
identifying that a transient power spike occurred;
in response to the transient power spike, identifying a plurality of parameters, the plurality of parameters including a measured impedance of the battery and a system during the transient power spike, an open circuit voltage of the battery, a direct-current impedance of the battery and the system, a first current of the battery during the transient power spike, and a second current of the battery over a duration of time that is longer than a duration of time of the transient power spike, calculating a voltage of a voltage droop during the transient power spike based on each of the plurality of parameters; and setting a peak power parameter based on the predicted peak power capacity and the voltage of the voltage droop, wherein the peak power parameter is to set a maximum power usage for a component that is to be powered by the battery.

12. The method of claim 11, further comprising:

determining one or more of prior direct current loading information and prior voltage information for the battery as part of the history information, wherein the peak power capacity corresponds to a maximum power that the battery is to output for a duration of time before a voltage output of the battery drops below a minimum allowable level above zero, and wherein the component is to be a processor.

13. The method of claim 11, further comprising:

setting the peak power parameter based on a subtraction operation based on a resting peak power value and an integration of measured power over a period of time, wherein the measured power is expressed in Watts.

14. The method of claim 11, further comprising:

predicting a greater peak power capacity based on history information which indicates the battery has been recently resting as compared to history information which indicates that the battery has been recently loaded.

15. The method of claim 11, further comprising:

setting the peak power parameter based on a minimum voltage of the system, a measured filtered voltage of the system, and a measured filtered current of the battery.

16. At least one non-transitory computer readable medium, comprising a set of instructions, which when executed by a computing device, cause the computing device to:

determine history information for a battery;

predict a peak power capacity of the battery based on the history information;

determine that a transient power spike occurred;

in response to the transient power spike, identify a plurality of parameters, the plurality of parameters including a measured impedance of the battery and a system during the transient power spike, an open circuit voltage of the battery, a direct-current impedance of the battery and the system, a first current of the battery during the transient power spike, and a second current of the battery over a duration of time that is longer than a duration of time of the transient power spike;

calculate a voltage of a voltage droop during the transient power spike based on each of the plurality of parameters; and set a peak power parameter based on the predicted peak power capacity and the voltage of the voltage droop, wherein the peak power parameter is to set a maximum power usage for a component that is to be powered by the battery.

17. The at least one non-transitory computer readable medium of claim 16, comprising a further set of instructions, which when executed by the computing device, cause the computing device to:

determine one or more of prior direct current loading information and prior voltage information for the battery as part of the history information, wherein the peak power capacity is to correspond to a maximum power that the battery is to output for a duration of time before a voltage output of the battery is to drop below a minimum allowable level above zero, and wherein the component is to be a processor.

18. The at least one non-transitory computer readable medium of claim 16, comprising a further set of instructions, which when executed by the computing device, cause the computing device to:

set the peak power parameter based on a subtraction operation based on a resting peak power value and an integration of measured power over a period of time, wherein the measured power is to be expressed in Watts.

19. The at least one non-transitory computer readable medium of claim 16, comprising a further set of instructions, which when executed by the computing device, cause the computing device to:

predict a greater peak power capacity based on history information which indicates the battery has been recently resting as compared to history information which indicates that the battery has been recently loaded.

20. The at least one non-transitory computer readable medium of claim 16, comprising a further set of instructions, which when executed by the computing device, cause the computing device to:

set the peak power parameter based on a minimum voltage of the computing device, a measured filtered voltage of the computing device, and a measured filtered current of the battery.

\* \* \* \* \*